(12) United States Patent
Ishii et al.

(10) Patent No.: US 11,158,395 B2
(45) Date of Patent: Oct. 26, 2021

(54) RELIABILITY EVALUATION APPARATUS

(71) Applicant: TOSHIBA MEMORY CORPORATION, Tokyo (JP)

(72) Inventors: Kazuyo Ishii, Kamakura Kanagawa (JP); Hiroaki Maekawa, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/556,917

(22) Filed: Aug. 30, 2019

(65) Prior Publication Data
US 2020/0294613 A1 Sep. 17, 2020

(30) Foreign Application Priority Data

Mar. 14, 2019 (JP) .............................. JP2019-047583

(51) Int. Cl.
| | | |
|---|---|---|
| *G11C 29/38* | (2006.01) | |
| *H01R 12/70* | (2011.01) | |
| *H01L 21/66* | (2006.01) | |
| *H01L 27/22* | (2006.01) | |

(52) U.S. Cl.
CPC .............. *G11C 29/38* (2013.01); *H01L 22/30* (2013.01); *H01R 12/7076* (2013.01); *H01L 27/222* (2013.01)

(58) Field of Classification Search
None
See application file for complete search history.

(56) References Cited

U.S. PATENT DOCUMENTS

| | | | | |
|---|---|---|---|---|
| 6,055,463 | A | * 4/2000 | Cheong | ................... B07C 5/344 |
| | | | | 700/223 |
| 9,747,967 | B2 | 8/2017 | Naeimi et al. | |
| 2006/0279306 | A1* | 12/2006 | Miyakawa | ............. G11C 29/56 |
| | | | | 324/750.05 |
| 2008/0111544 | A1* | 5/2008 | Patland | ..................... H01F 7/20 |
| | | | | 324/232 |
| 2014/0139209 | A1* | 5/2014 | Lee | .................. G11C 29/56016 |
| | | | | 324/211 |

(Continued)

FOREIGN PATENT DOCUMENTS

| | | |
|---|---|---|
| JP | H11190756 A | 7/1999 |
| JP | H11304874 A | 11/1999 |

(Continued)

*Primary Examiner* — April Y Blair
*Assistant Examiner* — Matthew W Wahlin
(74) *Attorney, Agent, or Firm* — Holtz, Holtz & Volek PC

(57) ABSTRACT

A reliability evaluation apparatus according to the present embodiment is provided with a housing and a board insertable into the housing. A plurality of sockets are provided on the board. Semiconductor devices are respectively attachable to socket. The plurality of sockets have electrodes electrically connectable to terminals of the semiconductor devices. A heater is provided inside the housing. A controller is connected to the plurality of sockets and to the heater. The controller controls a voltage to be applied to the terminal of the semiconductor device and controls an output of the heater. A plurality of electromagnets are arranged inside the housing so as to be positioned above or below the plurality of sockets when the board is inserted into the housing.

15 Claims, 11 Drawing Sheets

(56) References Cited

U.S. PATENT DOCUMENTS

2016/0055951 A1\* 2/2016 Kishi ............... G11C 29/56016
                                                    365/158
2016/0372212 A1\* 12/2016 Kishi .................... G11C 29/44

FOREIGN PATENT DOCUMENTS

| JP | 2001124817 A | 5/2001 |
| JP | 2001124821 A | 5/2001 |
| JP | 2006317403 A | 11/2006 |
| JP | 2010210348 A | 9/2010 |
| JP | 2017535907 A | 11/2017 |

\* cited by examiner

RELIABILITY EVALUATION APPARATUS

CROSS REFERENCE TO RELATED APPLICATIONS

This application is based upon and claims the benefit of priority from the prior Japanese Patent Application No. 2019-047583, filed on Mar. 14, 2019, the entire contents of which are incorporated herein by reference.

FIELD

The embodiments of the present invention relate to a reliability evaluation apparatus.

BACKGROUND

In a reliability test for memories, such as magnetoresistive memories, temperature and voltage application is performed in some cases to the package of a magnetoresistive memory in order to shorten an evaluation time for a write/erase cycle, etc.

However, there is a demand for further accelerating a memory aging rate to efficiently evaluate the memory.

DETAILED DESCRIPTION

Figure 1:
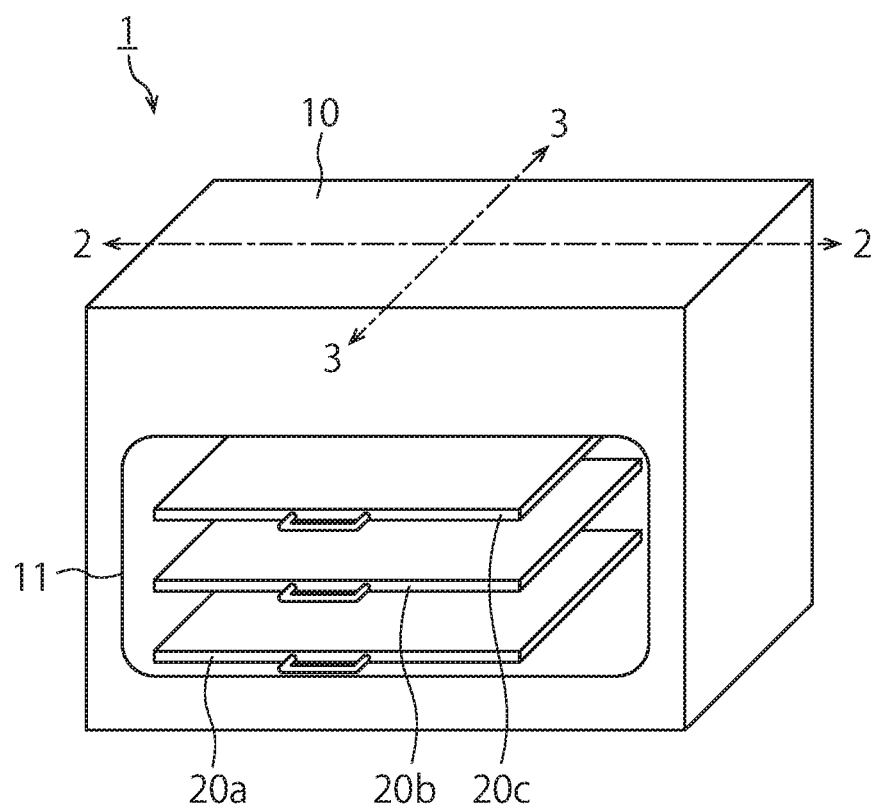
FIG. 1 is a perspective view schematically showing an example of the configuration of a reliability evaluation apparatus according to a first embodiment.

Embodiments will now be explained with reference to the accompanying drawings. The present invention is not limited to the embodiments. In the following embodiments, the vertical direction of a board indicates a relative direction in the case where a surface of the board on which a semiconductor device is mounted is defined as an upper surface. Therefore, the term "upper direction" or "lower direction" occasionally differs from an upper direction or a lower direction based on a gravitational acceleration direction. In the present specification and the drawings, elements identical to those described in the foregoing drawings are denoted by like reference characters and detailed explanations thereof are omitted as appropriate.

A reliability evaluation apparatus according to the present embodiment is provided with a housing and a board insertable into the housing. A plurality of sockets are provided on the board. Semiconductor devices are respectively attachable to socket. The plurality of sockets have electrodes electrically connectable to terminals of the semiconductor devices. A heater is provided inside the housing. A controller is connected to the plurality of sockets and to the heater. The controller controls a voltage to be applied to the terminal of the semiconductor device and controls an output of the heater. A plurality of electromagnets are arranged inside the housing so as to be positioned above or below the plurality of sockets when the board is inserted into the housing.

First Embodiment

FIG. 1 is a perspective view schematically showing an example of the configuration of a reliability evaluation apparatus according to a first embodiment. A reliability evaluation apparatus (also simply referred to as an evaluation apparatus, hereinafter) 1 is provided with a housing 10 and socket boards 20a to 20c. The housing 10 is configured so that it can house the socket boards 20a to 20c. In FIG. 1, the housing 10 can house three socket boards 20a to 20c. However, the housing 10 may be configured so that it can accommodate two or less or four or more boards.

The housing 10 has an opening 11 through which the socket boards 20a to 20c can be inserted or ejected. The opening 11 is provided with a cover (not shown) which is closed to make the housing 10 airtight inside thereof when executing an evaluation test.

Figure 2:
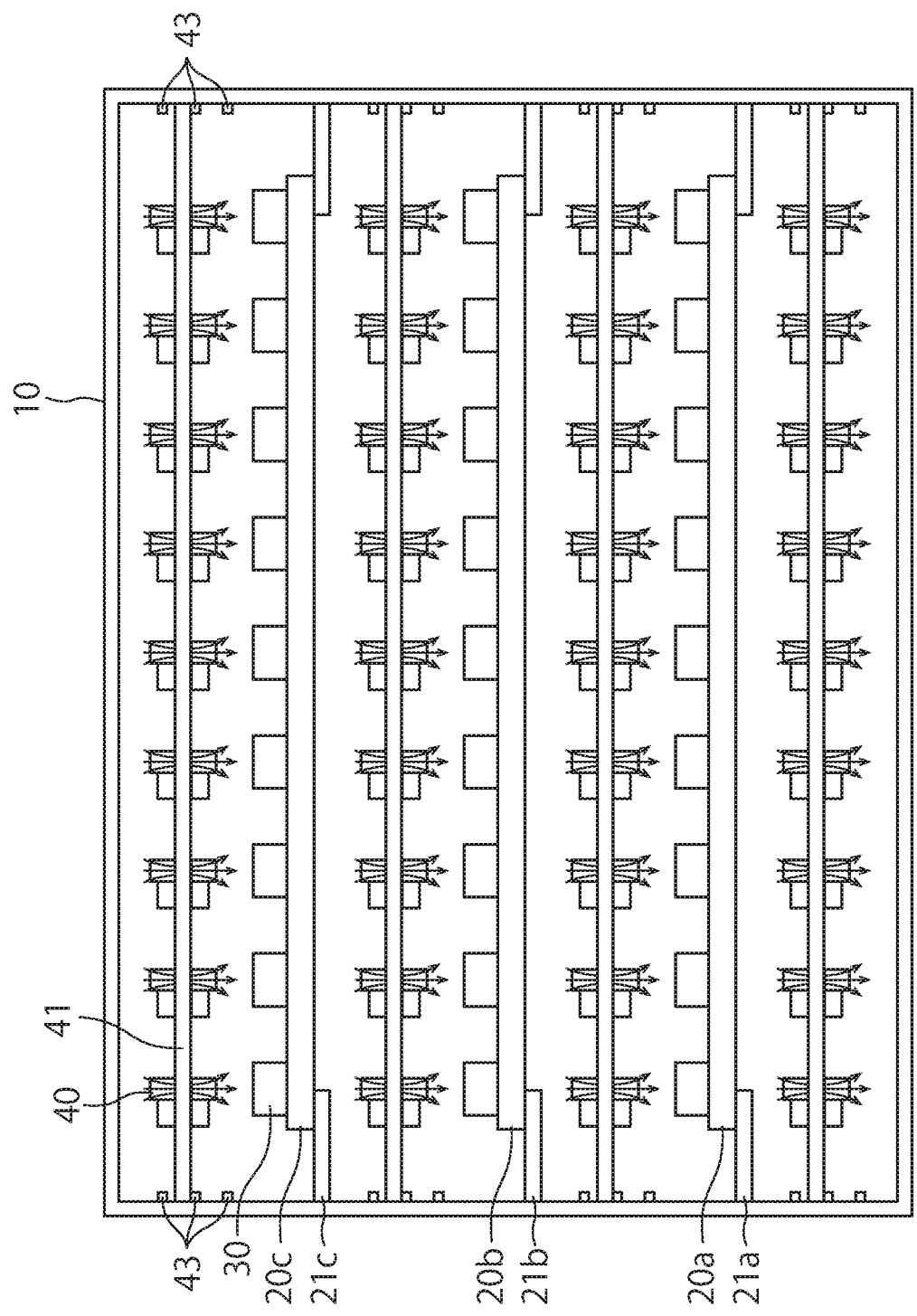
FIG. 2 is a schematic sectional view taken on line 2-2 of FIG. 1.
Figure 3:
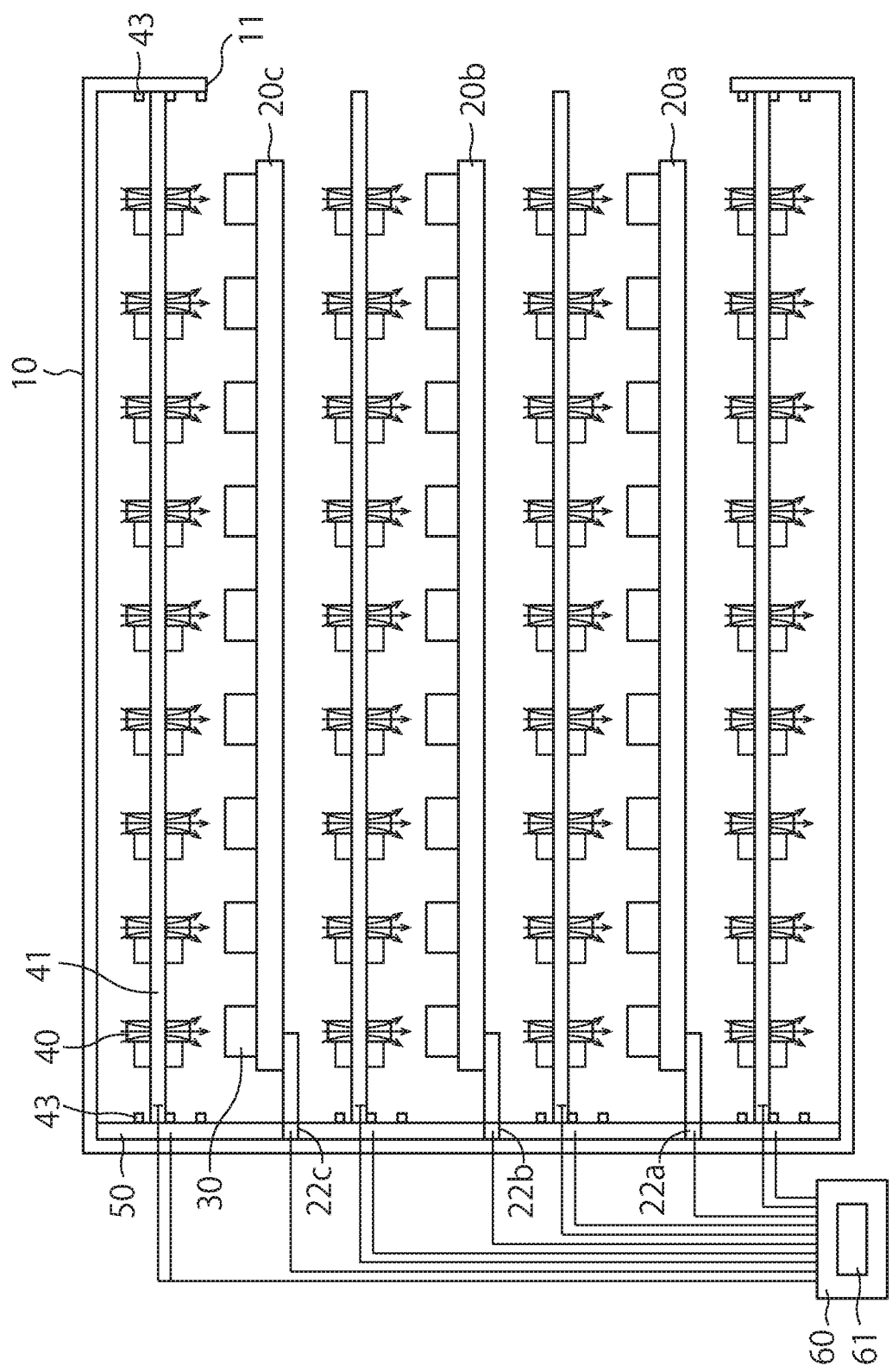
FIG. 3 is a sectional view taken on line 3-3 of FIG. 1.

FIG. 2 is a schematic sectional view taken on line 2-2 of FIG. 1. FIG. 3 is a sectional view taken on line 3-3 of FIG. 1. The evaluation apparatus 1 is provided with support portions 21a to 21c, board electrodes 22a to 22c, a plurality of sockets 30, a plurality of electromagnet boards 41, a plurality of electromagnets 40, a heater 50, a controller 60, and a counter 61.

In FIG. 2, the support portions 21a to 21c are fixed to the inner wall surface of the housing 10 to support the socket boards 20a to 20c, respectively. When inserted from the opening 11, the socket boards 20a to 20c slide on the support portions 21a to 21c, respectively, to be housed inside the housing 10.

The plurality of sockets 30 are two-dimensionally arranged on the socket boards 20a to 20c. To each of the sockets 30, a magnetoresistive memory (not shown) as a semiconductor device is attachable. Each socket 30 has an electrode (not shown) which is electrically connectable with a terminal of the magnetoresistive memory when the magnetoresistive memory is fit into the socket 30.

The plurality of electromagnet boards 41 are arranged in the housing 10 substantially parallel to one another and are fixed to the inner wall of the housing 10. The plurality of electromagnets 40 are two-dimensionally arranged and fixed on the upper surface and the lower surface (or may be arranged on either the upper or the lower surface) of each electromagnet board 41. Although not shown, the electromagnets 40 are connected to the controller 60 with wirings provided inside the electromagnet boards 41, to generate magnetic fields by currents from the controller 60.

The electromagnet boards 41 may be configured to be detachable from the housing 10. In this case, it is preferable for the electromagnet boards 41 to be configured to be disposed at any given height or position in the housing 10.

For example, support portions 43 for supporting each electromagnet board 41 are provided on the inner wall surface of the housing 10 at different heights. The height of the electromagnet board 41 can be set to a desired height by mounting the electromagnet board 41 on a support portion 43 provided at a given height.

In the housing 10, the socket boards 20a to 20c can be inserted substantially parallel to one another between the plurality of electromagnet boards 41. Accordingly, the electromagnets 40 are arranged between the adjacent socket boards 20a and 20b, between the adjacent socket boards 20b and 20c, above the uppermost socket board 20c, and under the lowermost socket board 20a, among the socket boards 20a to 20c.

The electromagnets 40 are provided corresponding to the sockets 30, respectively, provided on the socket boards 20a to 20c. Therefore, the number of electromagnets 40 provided on each electromagnet board 41 is equal to or an integral multiple of the number of sockets 30 (or magnetoresistive memories) provided on each of the socket boards 20a to 20c. When the socket boards 20a to 20c are inserted into the housing 10, the electromagnets 40 are arranged at above or below (right above or right below) the sockets 30. Accordingly, although having a small size, the electromagnets 40 can efficiently apply magnetic fields to the magnetoresistive memories on the sockets 30.

The electromagnets 40 are each configured with, for example, a conducting wire covered with an insulating film wound around a magnetic material such as an iron core, a magnetic field being generated by the iron core with a current flowing through the conducting wire. The orientation of the magnetic field is toward the sockets 30 (that is, the magnetoresistive memories) or its reverse direction. However, the orientation of the magnetic fields of the electromagnets 40 provided on an electromagnet board 41 is preferably the same orientation of the magnetic fields of the electromagnets 40 provided on another electromagnet board 41. In this way, the electromagnets 40 located above and below the magnetoresistive memories can apply the magnetic fields oriented in the same direction to the magnetoresistive memories, so that relatively strong magnetic fields can be applied to the magnetoresistive memories. If, conversely, the electromagnets 40 located above and below the magnetoresistive memories apply the magnetic fields oriented in the reverse direction to the magnetoresistive memories, the magnetic fields cancel each other, so that the magnetic fields applied to the magnetoresistive memories become weaken. Therefore, the orientations of the magnetic fields of the electromagnets 40 provided on the plurality of electromagnet boards 41 are preferably the same direction.

In FIG. 3, the board electrodes 22a to 22c are provided at ends of the socket boards 20a to 20c, respectively, and connected to the electrodes of the sockets 30 via internal wirings (not shown) in the socket boards 20a to 20c. Moreover, when inserted into the housing 10, the board electrodes 22a to 22c are brought into electrical contact with electrodes (not shown) provided to the side wall of the housing 10 at the far side. The electrodes of the housing 10 are electrically connected to the controller 60. In this way, the electrodes of the sockets 30 are electrically connected to the controller 60.

The controller 60 can apply a desired voltage and signal to the terminals of the magnetoresistive memories via the board electrodes 22a to 22c and the electrodes of the sockets 30 or can receive outputs from the magnetoresistive memories. In this way, the controller 60 refers to data read from the magnetoresistive memories to detect a data error (inversion of written data). Moreover, the controller 60 counts data errors at regular intervals. Therefore, the controller 60 can count the number of bits (the number of memory cells) that are changed to be errors as time elapses during an evaluation test. When the number of error bits is equal to or larger than a threshold value, the controller 60 determines the magnetoresistive memory having those error bits, as a defective memory. The counter 61 counts the number of magnetoresistive memories determined by the controller 60 as defective memories. The controller 60 may execute the procedure up to counting the number of error bits, and then an external apparatus or an operator may perform the determination of defective memories.

The controller 60 can apply power to the electromagnets 40 via wirings provided inside the electromagnet boards 41 and can control the currents of the electromagnets 40 individually. Accordingly, magnetic fields under different conditions from one another can be applied to the magnetoresistive memories. Arrows of the electromagnets 40 indicate the orientation of magnetic fields. By feeding currents in the reverse direction, the direction of magnetic fields can be turned to the reverse direction.

The heater 50 is provided on the inner wall surface of the housing 10 and electrically connected to the controller 60. The controller 60 can control the output of the heater 50 to set the temperature inside the housing 10 to a desired temperature.

Figure 4:
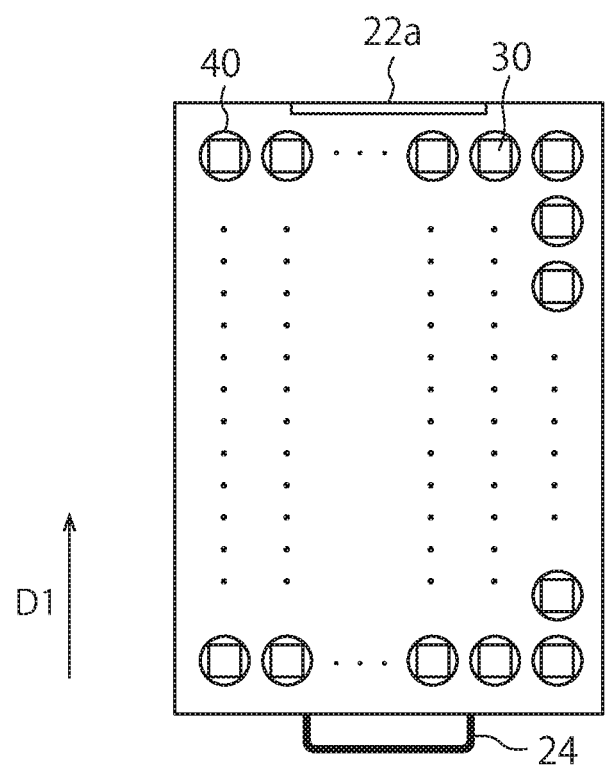
FIG. 4 is a plan view showing a positional relationship between a board and coils of electromagnets.

FIG. 4 is a plan view showing a positional relationship between the socket board 20a and the coils of the electromagnets 40. The relationship between the socket boards 20b and 20c, and their corresponding electromagnets 40 is the same as the relationship shown in FIG. 4, and hence its detailed explanation is omitted.

The socket board 20a has a handle 24 in the near side and the board electrode 22a in the far side, in a direction D1 in which the socket board 20a is inserted into the housing 10. On the front surface of the socket board 20a, the sockets 30 are two-dimensionally arranged in a matrix. To the sockets 30, packages (not shown) of the magnetoresistive memories are detachably attached.

The socket board 20a is inserted into the housing 10 through the opening 11 in the direction D1. When the socket board 20a is inserted into the housing 10, the coils of the electromagnets 40 and the sockets 30, fixed in the housing 10, correspond to each other and overlap with each other, when the socket board 20a is viewed from above.

Figure 5:
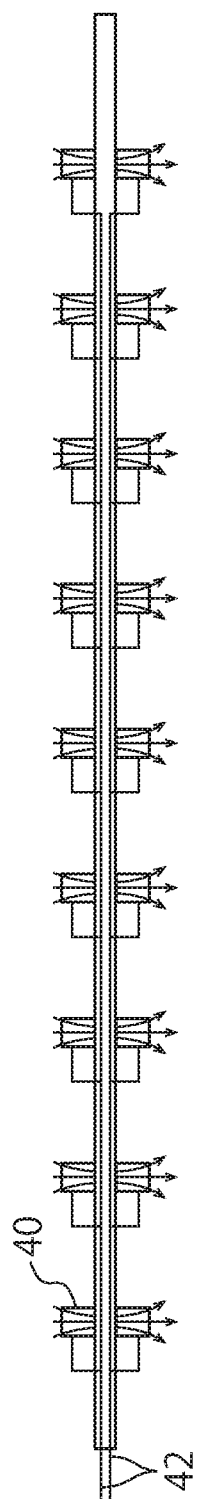
FIG. 5 is a sectional view showing a configuration example of an electromagnet board and electromagnets.

FIG. 5 is a sectional view showing a configuration example of each electromagnet board 41 and the electromagnets 40. The electromagnets 40 are arranged on the upper and lower surfaces of the electromagnet board 41. Wirings 42 are provided inside the electromagnet board 41. The wirings 42 are electrically connected to the controller 60 located outside the housing 10.

Figure 6:
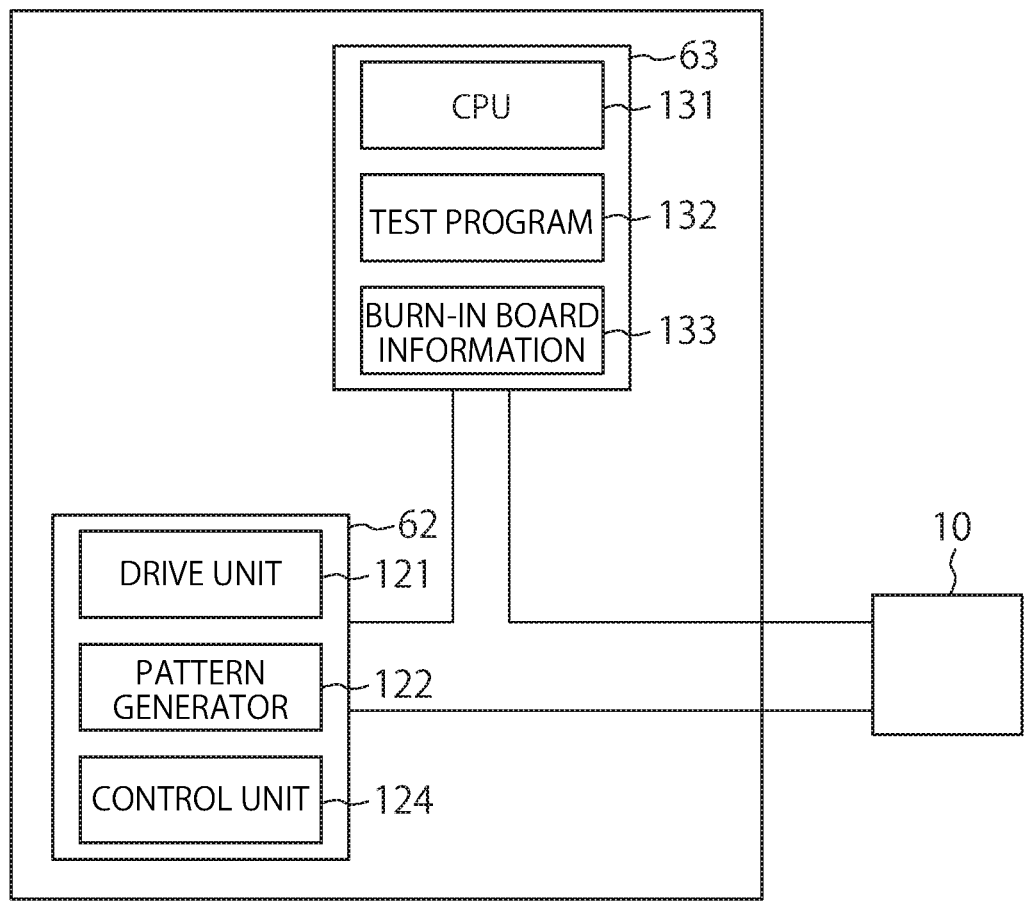
FIG. 6 is a block diagram showing an example of the configuration of a controller.

FIG. 6 is a block diagram showing an example of the configuration of the controller 60. The controller 60 is provided with a pattern control unit 62 for applying a test voltage pattern to the sockets 30 or a test current pattern to the electromagnets 40, and is provided further with a control computer 63 for controlling the heater 50 of the housing 10, the pattern control unit 62, etc. Although omitted in FIG. 6, the counter 61 may be provided inside the pattern control unit 62 or the control computer 63, or may be provided inside the controller 60, but separately from the pattern control unit 62 and the control computer 63.

The pattern control unit 62 is provided with a pattern generator 122 for generating a test pattern signal to be applied to the magnetoresistive memories, a drive unit 121 for applying the test pattern signal to the magnetoresistive memories attached to the sockets 30, and a control unit 124 for controlling the respective units based on an instruction from the control computer 63.

The control computer 63 has a CPU (Central Processing Unit) 131 and a memory unit that has stored a test program 132 to be executed by the CPU 131 and burn-in board information 133. The control computer 63 is configured with a general computer system. The control computer 63 controls the heater 50 so that the temperature inside the housing 10 becomes a predetermined temperature. The memory unit, which has stored the test program 132 and the burn-in board information 133, may be a ROM (Read Only Memory), a RAM (Random Access Memory), an HDD (Hard Disk Drive), an SSD (Solid State Drive), etc.

Figure 7A:
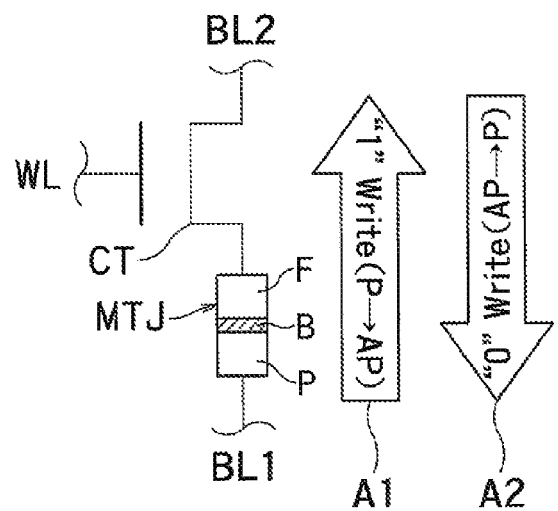
FIGS. 7A and 7B are illustrations respectively showing an overview of an MRAM as an example of the magnetoresistive memory.
Figure 7B:
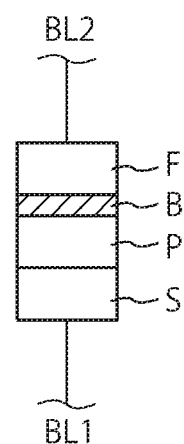

FIGS. 7A and 7B are illustrations respectively showing an overview of an MRAM (Magnetic Random Access Memory) as an example of the magnetoresistive memory. An MTJ (Magnetic Tunnel Junction) element, utilizing a TMR (Tunneling Magnetoresistive) effect, has a stacked configuration of two ferromagnetic layers F and P, and a non-magnetic layer (an insulating thin film) B interposed therebetween. The MTJ element stores digital data in accordance with change in magnetic resistance caused by a spin polarized tunneling effect. The MTJ element can take a low resistance state and a high resistance state depending on magnetization alignment in the two ferromagnetic layers F and P. For example, when the low resistance state and the high resistance state are defined as data "0" and "1", respectively, 1-bit data can be recorded in the MTJ element. It is a matter of course that the low resistance state and the high resistance state may be defined as data "1" and "0", respectively, For example, the MTJ element is configured by stacking a fixed layer (Pin layer) P, a tunnel insulating film B, and a recording layer (Free layer) F in order. The Pin layer P and the Free layer F are configured with a ferromagnetic body. The tunnel insulating film B is configured with an insulating film (for example, $Al_2O_3$, MgO). The Pin layer P is a layer with a fixed magnetization direction whereas the Free layer F is a layer with a changeable magnetization direction to store data depending on the magnetization direction.

In writing, when feeding a current equal to or larger than an inversion threshold current in a direction of an arrow A1, the magnetization direction of the Free layer F becomes an anti-parallel state (AP state) to the magnetization direction of the Pin layer P, so that the MTJ element becomes the high resistance state (data "1"). In writing, when feeding a current equal to or larger than the inversion threshold current in a direction of an arrow A2, the magnetization directions of the Pin layer P and the Free layer F become a parallel state (P state), so that the MTJ element becomes the low resistance state (data "0"). As described above, different data depending on the current direction can be written in the MTJ element.

The Pin layer P and the Free layer F may be reversed each other in the positional relationship. In this case, with the current also in the reverse direction, data can be written as described above.

In FIG. 7A, the MRAM has the three-terminal type MOS transistor CT as a switching element. However, the MRAM may have a two-terminal type switching element S as a switching element as shown in FIG. 7B. In the case of the two-terminal switching element S, when the voltage applied between the two terminals is equal to or less than a threshold, the switching element S is in the "off" state (for example, an electrically high resistance state). When the voltage applied between the two terminals is above the threshold, the switching element S changes to an "on" state (for example, an electrically low resistance state).

The evaluation apparatus 1 according to the present embodiment described above can simultaneously apply, in an evaluation test, the voltage and magnetic field to a lot of magnetoresistive memories in a high temperature atmosphere. By applying, not only the voltage, but also the magnetic field to the magnetoresistive memories, the evaluation apparatus 1 can test a lot of magnetoresistive memories simultaneously in a short time and also can perform reliability evaluation at a low cost.

Figure 8:
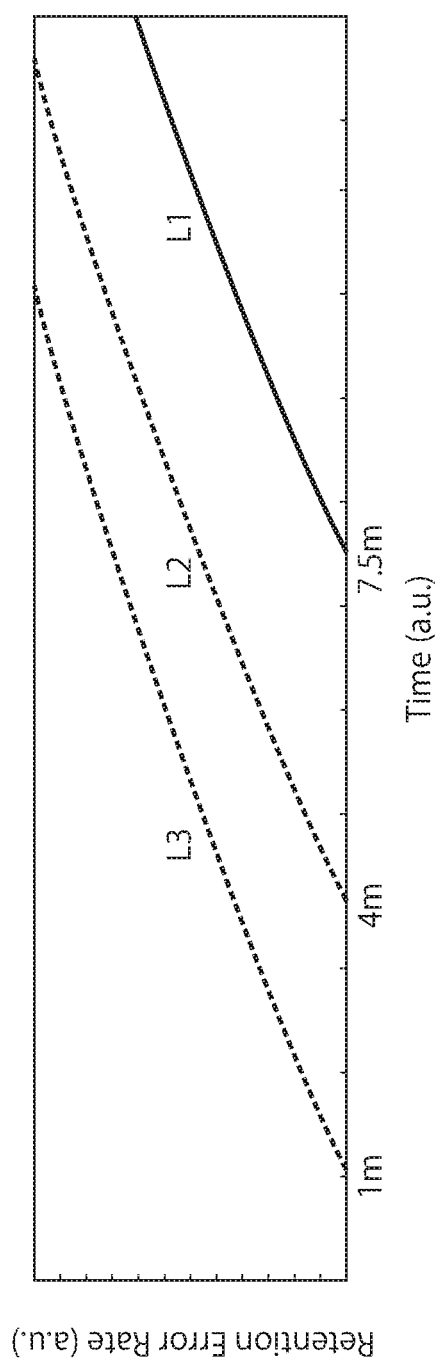
FIG. 8 is a graph showing an error rate obtained when the MRAM was evaluated by an evaluation apparatus.

FIG. 8 is a graph showing an error rate obtained when an MRAM was evaluated by the evaluation apparatus 1. In this graph, the ordinate indicates an error rate in data retention characteristics and the abscissa indicates an evaluation test time. L1 indicates an error rate in a room temperature (about 25° C.) atmosphere with no application of magnetic field. L2 indicates an error rate in a high temperature (about 90° C.) atmosphere with no application of magnetic field. L3 indicates an error rate in a high temperature (about 90° C.) atmosphere with application of magnetic field of about several 100 Oe. The same voltage was applied in L1 to L3.

In L1, the error rate hardly increased even though the MRAM had been left for long hours, but started to increase after 7.5 months from when the MRAM was left. In L2, the error rate started to increase after four months from when the MRAM was left. In L3, the error rate started to increase after one month from when the MRAM was left. From this result, it is found out that, under the conditions (room temperature, without magnetic field) of L1, the evaluation test took much time, and hence cannot be used as an accelerated aging test. Under the conditions (high temperature, without magnetic field) of L2, although the evaluation test time was shortened, the evaluation test took much time. In contrast to above, under the conditions (high temperature, with magnetic field) of L3, as an accelerated aging test, the evaluation test time was markedly shortened.

As described above, for MRAMs, the accelerated aging test can be accelerated by applying the magnetic field, not only by the temperature and voltage.

Second Embodiment

Figure 9:
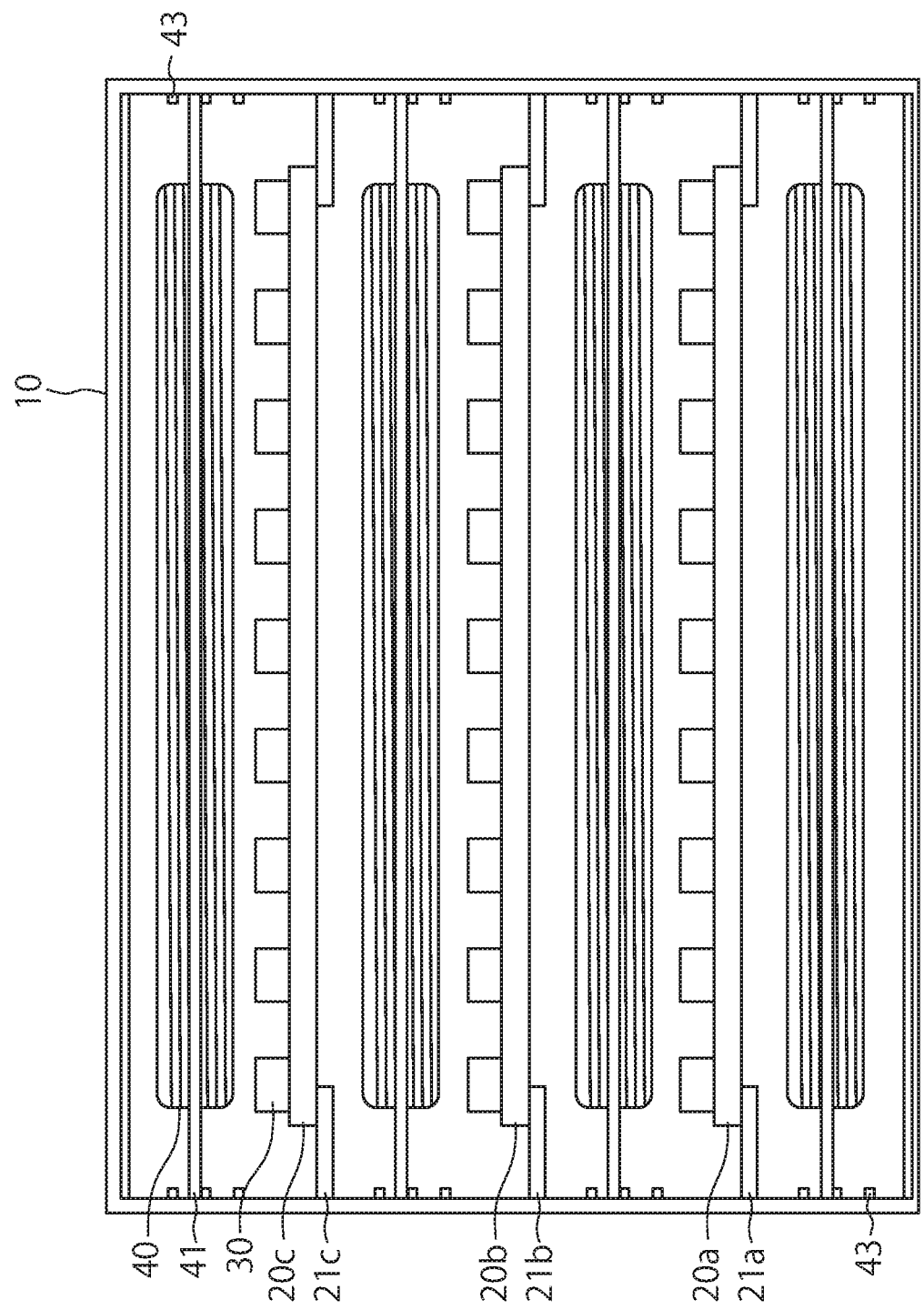
FIG. 9 is a sectional view showing a configuration example of an evaluation apparatus according to a second embodiment.
Figure 10:
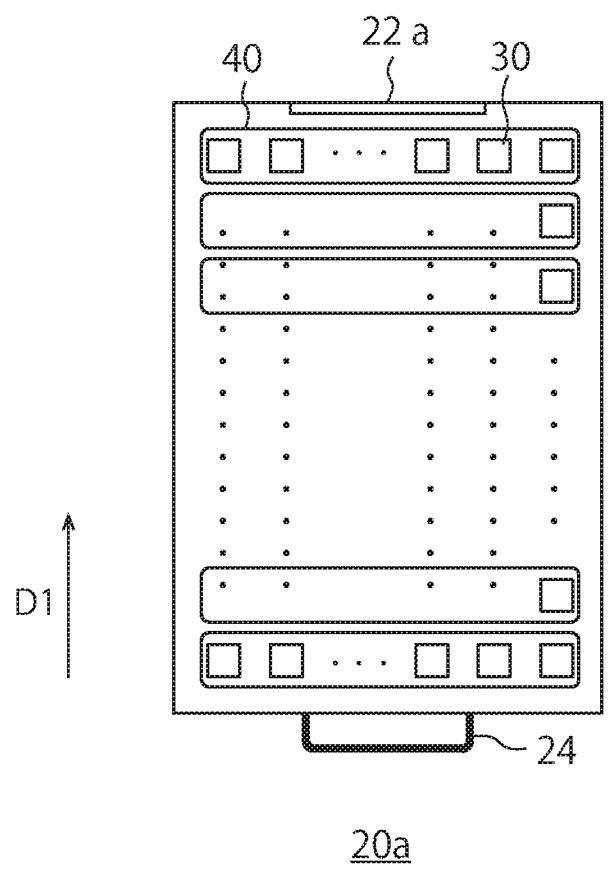
FIG. 10 is a plan view showing a positional relationship between a board and coils of electromagnets.

FIG. 9 is a sectional view showing a configuration example of an evaluation apparatus 1 according to a second embodiment. The section shown in FIG. 9 corresponds to the section taken on line 2-2 of FIG. 1. FIG. 10 is a plan view showing a positional relationship between a socket board 20a and the coils of electromagnets 40. The relationship between socket boards 20b, 20c and their corresponding electromagnets 40 is the same relationship between the socket board 20a and the corresponding electromagnets 40, hence the detailed description thereof is omitted.

The socket board 20a according to the second embodiment may have the same configuration as the socket board 20a of the first embodiment.

In the second embodiment, a coil of each electromagnet 40 is provided to be shared by a row (socket row) of a plurality of sockets 30 aligned in a direction substantially orthogonal to D1. Therefore, each electromagnet 40 has a long and narrow shape extending in a direction substantially orthogonal to D1. A plurality of long and narrow electromagnets 40 are aligned in the direction of D1.

As described above, each electromagnet 40 may be provided corresponding to a plurality of sockets 30. Moreover, each electromagnet 40 may be provided to be shared by a row of a plurality of sockets 30 aligned in the direction of D1. The second embodiment achieves the same effects as the first embodiment.

Third Embodiment

Figure 11:
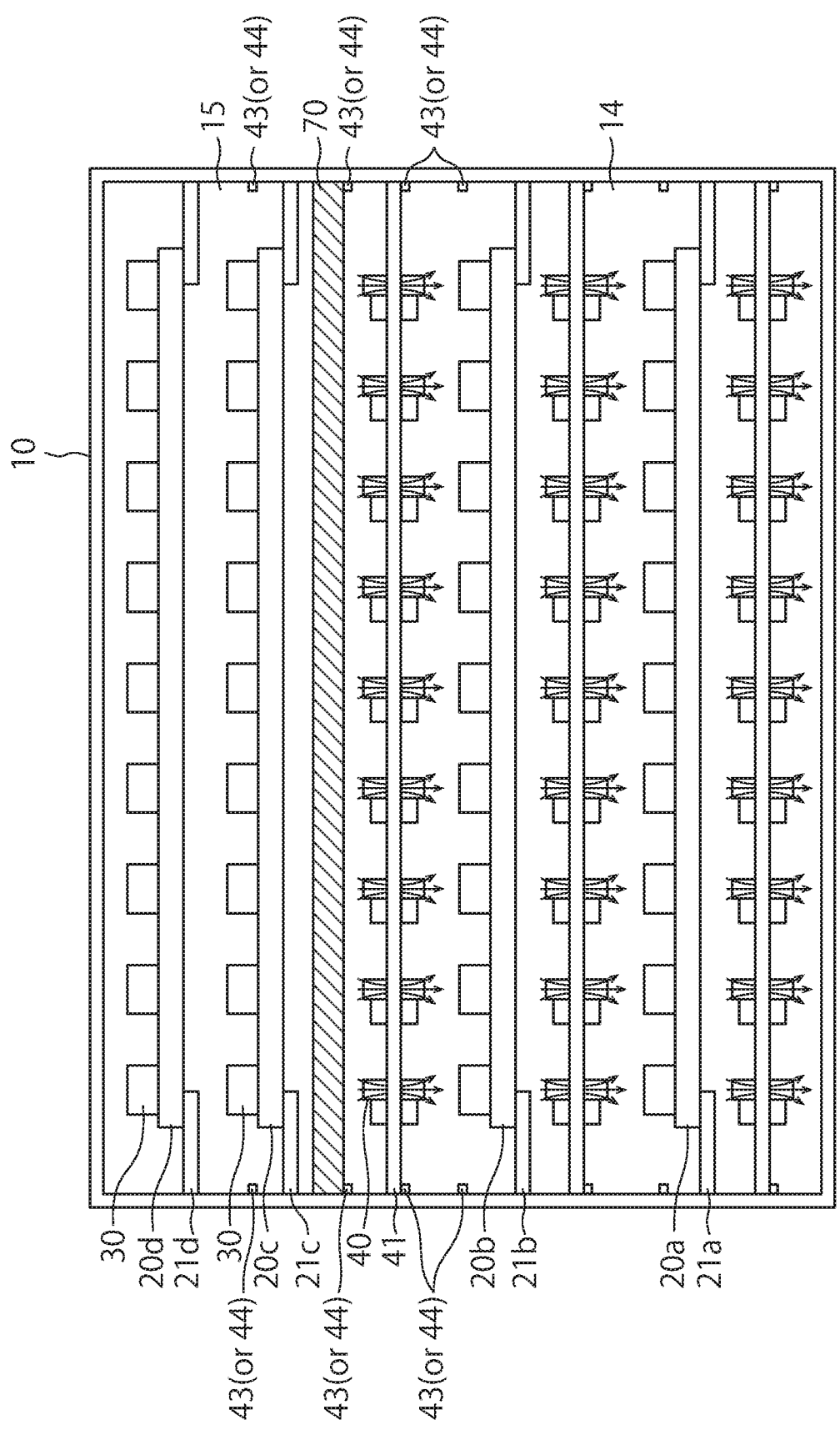
FIG. 11 is a sectional view showing a configuration example of an evaluation apparatus according to a third embodiment.

FIG. 11 is a sectional view showing a configuration example of an evaluation apparatus 1 according to a third embodiment. The section shown in FIG. 11 corresponds to the section taken on line 2-2 of FIG. 1.

In the third embodiment, a magnetic shield board 70 that does not allow a magnetic field to pass therethrough is provided inside the housing 10. The magnetic shield board 70 is provided substantially parallel with the electromagnet boards 41 or the socket boards 20a to 20d and provided between a lower area 14 and an upper area 15 in the housing 10. The magnetic shield board 70 partitions the inner wall of the housing 10 so as not to allow a magnetic field to pass through between the areas 14 and 15.

The magnetic shield board 70 may also be detachable from the housing 10, like the electromagnet boards 41. In this case, it is preferable for the magnetic shield board 70 to be configured to be disposed at any given height or position in the housing 10. For example, support portions 44 for supporting the magnetic shield board 70 are provided on the inner wall surface of the housing 10 at different heights. The height of the magnetic shield board 70 can be set to a desired height by mounting the magnetic shield board 70 on a support portion 44 provided at a given height. The magnetic shield board 70 may share the support portions with the electromagnet boards 41. Therefore, the support portions 43 and 44 may support either of the magnetic shield board 70 and the electromagnet boards 41.

Any of the socket boards 20a to 20c may be removed in order to dispose the magnetic shield board 70 or the electromagnet boards 41 at any given height.

In the area 14, electromagnets 40 for applying magnetic fields are provided like the first or the second embodiment. In the area 15, the electromagnets 40 are not provided, so that magnetic fields are not applied to the magnetoresistive memories. The other configuration of the third embodiment may be the same as the first or the second embodiment.

Having the magnetic shield board 70 provided as described above, the evaluation apparatus 1 can simultaneously perform an evaluation test with application of high temperature and voltage but with no application of magnetic field and an evaluation test with application of high temperature, voltage, and magnetic field.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A reliability evaluation apparatus comprising:
a housing;
a board insertable into the housing;
a plurality of sockets provided on the board, magnetoresistive memories being respectively attachable to the plurality of sockets, and each of the plurality of sockets having an electrode electrically connectable to a terminal of the magnetoresistive memory attached thereto;
a heater provided inside the housing;
a controller connected to the plurality of sockets and to the heater, the controller controlling a voltage to be applied to the terminals of the magnetoresistive memories and controlling an output of the heater; and
a plurality of electromagnets arranged inside the housing so that electromagnets, from among the plurality of electromagnets, are positioned above and below each of the plurality of sockets when the board is inserted into the housing,
wherein a corresponding pair of electromagnets positioned above and below a same one of the plurality of sockets apply magnetic fields which are oriented in a same direction.

2. The reliability evaluation apparatus according to claim 1, wherein each of the plurality of electromagnets is provided at a position corresponding to one of the plurality of sockets.

3. The reliability evaluation apparatus according to claim 2, further comprising a counter counting a number of the magnetoresistive memories determined to be an error by the controller.

4. The reliability evaluation apparatus according to claim 2, wherein a plurality of boards are insertable into the housing so as to be substantially parallel to one another, and
the plurality of electromagnets are arranged between adjacent boards, above an uppermost board, and below a lowermost board, among the plurality of boards.

5. The reliability evaluation apparatus according to claim 1, wherein the plurality of sockets are two-dimensionally arranged on the board, and
the plurality of electromagnets are provided at positions corresponding to a socket row of the plurality of sockets.

6. The reliability evaluation apparatus according to claim 5, further comprising a counter counting a number of the magnetoresistive memories determined to be an error by the controller.

7. The reliability evaluation apparatus according to claim 5, wherein a plurality of boards are insertable into the housing so as to be substantially parallel to one another, and
the plurality of electromagnets are arranged between adjacent boards, above an uppermost board, and below a lowermost board, among the plurality of boards.

8. The reliability evaluation apparatus according to claim 1, further comprising a counter counting a number of the magnetoresistive memories determined to be an error by the controller.

9. The reliability evaluation apparatus according to claim 8, wherein a plurality of boards are insertable into the housing so as to be substantially parallel to one another, and
the plurality of electromagnets are arranged between adjacent boards, above an uppermost board, and below a lowermost board, among the plurality of boards.

10. The reliability evaluation apparatus according to claim 8, wherein the counter counts data errors of the magnetoresistive memories.

11. The reliability evaluation apparatus according to claim 1, wherein a plurality of boards are insertable into the housing so as to be substantially parallel to one another, and
the plurality of electromagnets are arranged between adjacent boards, above an uppermost board, and below a lowermost board, among the plurality of boards.

12. The reliability evaluation apparatus according to claim 11, wherein electromagnets, from among the plurality of electromagnets, which are arranged above and below a respective one of the plurality of boards apply magnetic fields which are oriented in a same direction.

13. The reliability evaluation apparatus according to claim 1, wherein electromagnets, from among the plurality of electromagnets, which are arranged above and below the board apply magnetic fields which are oriented in a same direction.

14. A reliability evaluation apparatus comprising:

a housing;

a board insertable into the housing;

a plurality of sockets provided on the board, magnetoresistive memories being respectively attachable to the plurality of sockets, and each of the plurality of sockets having an electrode electrically connectable to a terminal of the magnetoresistive memory attached thereto;

a heater provided inside the housing;

a controller connected to the plurality of sockets and to the heater, the controller controlling a voltage to be applied to the terminals of the magnetoresistive memories and controlling an output of the heater;

a plurality of electromagnets arranged inside the housing so as to be positioned above or below the plurality of sockets when the board is inserted into the housing; and a magnetic shield board provided between a first set of the plurality of sockets and a second set of the plurality of sockets, the magnetic shield board restricting transmission of a magnetic field, wherein the electromagnets are provided in one area of the housing partitioned by the magnetic shield board, and are not provided in another area of the housing partitioned by the magnetic shield board.

15. A reliability evaluation apparatus comprising:

a housing;

a board insertable into the housing;

a plurality of sockets provided on the board, magnetoresistive memories being respectively attachable to the plurality of sockets, and each of the plurality of sockets having an electrode electrically connectable to a terminal of the magnetoresistive memory attached thereto;

a heater provided inside the housing;

a controller connected to the plurality of sockets and to the heater, the controller controlling a voltage to be applied to the terminals of the magnetoresistive memories and controlling an output of the heater; and a plurality of electromagnets arranged inside the housing so as to be positioned above or below the plurality of sockets when the board is inserted into the housing, wherein the heater is provided on an inner wall opposing an opening of the housing and extends in a direction substantially orthogonal to an insertion direction of the board.

* * * * *